(12) United States Patent
Sato et al.

(10) Patent No.: US 8,273,505 B2
(45) Date of Patent: Sep. 25, 2012

(54) MASK BLANK AND METHOD OF MANUFACTURING AN IMPRINT MOLD

(75) Inventors: Takashi Sato, Shinjuku-ku (JP); Mitsuhiro Kureishi, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 201 days.

(21) Appl. No.: 12/680,355

(22) PCT Filed: Sep. 26, 2008

(86) PCT No.: PCT/JP2008/067380
§ 371 (c)(1),
(2), (4) Date: Mar. 26, 2010

(87) PCT Pub. No.: WO2009/041551
PCT Pub. Date: Apr. 2, 2009

(65) Prior Publication Data
US 2010/0255411 A1    Oct. 7, 2010

(30) Foreign Application Priority Data

Sep. 27, 2007  (JP) ................. 2007-251244

(51) Int. Cl.
*G03F 1/22*  (2012.01)
(52) U.S. Cl. .......................................... 430/5
(58) Field of Classification Search .............. 430/5, 311, 430/394; 216/12; 205/70
See application file for complete search history.

(56) References Cited

U.S. PATENT DOCUMENTS

| 7,618,753 B2* | 11/2009 | Yoshikawa et al. ............. 430/5 |
| 2002/0100691 A1* | 8/2002 | Bonivert et al. ............. 205/70 |
| 2005/0277034 A1 | 12/2005 | Mitsui |
| 2008/0206655 A1 | 8/2008 | Nozawa et al. |

FOREIGN PATENT DOCUMENTS

| CN | 101010631 A | 8/2007 |
| JP | 2005-530338 A | 10/2005 |
| JP | 2005-345737 A | 12/2005 |
| JP | 2006-078825 A | 3/2006 |
| JP | 2007-241135 A | 9/2007 |
| JP | 2007-241136 A | 9/2007 |
| JP | 2008-209873 A | 9/2008 |
| WO | WO 2007074810 A1 | 7/2007 |

OTHER PUBLICATIONS

Chinese Office Action corresponding to Chinese Patent Application No. 200880108918.0, dated Sep. 30, 2011.

* cited by examiner

*Primary Examiner* — Stephen Rosasco
(74) *Attorney, Agent, or Firm* — Sughrue Mion, PLLC

(57) ABSTRACT

Provided is a method of manufacturing an imprint mold formed with a highly accurate fine pattern by the use of a mask blank.

In a mask blank having a thin film for forming a pattern on a transparent substrate, the thin film comprises an upper layer formed of a material containing Cr and nitrogen and a lower layer formed of a material containing a compound mainly composed of Ta and capable of being etched by dry etching using a chlorine-based gas. The upper layer and the lower layer of the thin film are etched by dry etching using a chlorine-based gas substantially free of oxygen and then the substrate is etched by dry etching using a fluorine-based gas, thereby obtaining an imprint mold.

8 Claims, 2 Drawing Sheets

MASK BLANK AND METHOD OF MANUFACTURING AN IMPRINT MOLD

TECHNICAL FIELD

This invention relates to a method of manufacturing an imprint mold (stamper) for use in the production of a semiconductor integrated circuit or the like or of an optical component having an optical function provided by a fine pattern or for use in the formation of a fine pattern on a magnetic disk and relates to a mask blank for use in the manufacture of the imprint mold.

BACKGROUND ART

Generally, fine pattern formation is carried out by a photolithography method in manufacturing processes of a semiconductor device. A number of substrates called photomasks are normally used for such fine pattern formation. The photomask is generally such that a light-shielding fine pattern comprising a metal thin film or the like is provided on a transparent glass substrate. The photolithography method is used also in the manufacture of the photomask.

The photomask or an imprint mold serves as a master for transferring the same fine pattern in large numbers. The dimensional accuracy of the pattern formed on the photomask directly affects the dimensional accuracy of a fine pattern to be formed. In the case of the imprint mold, the sectional shape of the pattern also affects the shape of a fine pattern to be formed. With the improvement in integration degree of a semiconductor circuit, the dimension of a pattern is reduced and thus the photomask or the imprint mold is also required to have higher accuracy. Particularly, in the case of the imprint mold, since pattern transfer is carried out on the same scale, the required accuracy is equal to that of the pattern of the semiconductor circuit and therefore the imprint mold is required to have higher accuracy than the photomask. Likewise, a component having an optical function provided by a fine pattern such as grating is also required to have a pattern dimension and pattern accuracy less than a target wavelength and therefore the photomask or the imprint mold for the production of the optical component is also required to have a fine and high-accuracy pattern.

In the manufacture of a conventional photomask or imprint mold, use is made of a mask blank having a thin film of chromium or the like formed on a transparent substrate of quartz glass or the like and, after coating a resist on the mask blank, a resist pattern is formed using electron beam exposure or the like and, using this resist pattern as a mask, the thin film is etched to thereby form a thin film pattern (mask pattern).

In the imprint mold, in order to irradiate light in transfer, there is a case where a stepped pattern is formed on the transparent substrate using the thin film pattern as a mask. Also in this case, the pattern dimension and accuracy of the transparent substrate is directly affected by the dimension and accuracy of the thin film pattern.

For example, as a means for etching the thin film containing chromium, use is normally made of wet etching using diammonium cerium (IV) nitrate or dry etching using a mixed gas of a chlorine-based gas and oxygen.

There are conventionally known a method of forming a thin film pattern comprising a plurality of layers by the use of multi-stage etching, thereby improving nonuniformity in etching width and depth of the chromium film (see, e.g. Patent Document 1: JP-A-2005-530338), a method of forming a relatively thin film pattern using a resist pattern as a mask and further, using the formed thin film pattern as a mask, forming thin film patterns of second and subsequent layers, thereby enabling a reduction in thickness of the resist (see, e.g. Patent Document 2: JP-A-2006-78825), and so on.

On the other hand, for a magnetic disk for use as a hard disk or the like, use has conventionally been made of a technique of minimizing the width of a magnetic head and narrowing spaces between data tracks where information is to be recorded, thereby achieving an increase in density. However, the increase in density has reached the limit with the conventional technique and it has become difficult to ignore a magnetic influence and a thermal fluctuation phenomenon between the adjacent tracks. Recently, there has been proposed a new type medium called a discrete track type medium (Discrete Track Recording Medium; hereinafter referred to as a DTR medium) in which data tracks of a magnetic disk are formed so as to be magnetically isolated from each other.

The DTR medium is intended to improve the signal quality by removing (grooving) a magnetic material at portions unnecessary for recording. Further, after the grooving, grooves are filled with a nonmagnetic material, thereby realizing the angstrom-level surface flatness required for a magnetic disk drive. As one of the techniques for this fine-width grooving, the imprint technique is used.

Further, there has also been proposed a new type medium called a patterned medium (medium adapted to record a signal as a dot pattern) which has been developed from the DTR medium by further increasing the density. Also in pattern formation of this patterned medium, the imprint technique is considered promising.

Patent Document 1: JP-A-2005-530338
Patent Document 2: JP-A-2006-78825

DISCLOSURE OF THE INVENTION

Problem to be Solved by the Invention

With the improvement in integration degree of a semiconductor circuit, its pattern is required to be further miniaturized. Also in the case of the magnetic disk, the demand for pattern miniaturization is strong in the imprint mold (stamper) for use for the DTR medium or the patterned medium. If the pattern is miniaturized, it is known that there arises a problem in etching for, for example, a chromium pattern even using an etching method of either wet etching or dry etching. The above-mentioned wet etching using diammonium cerium (IV) nitrate is advantageous in that a problem such as resist recession or disappearance hardly occurs, but on the other hand, there are problems that the sectional shape of the chromium pattern does not become vertical, that etching bias occurs in which the chromium film is etched in a horizontal direction in pattern section with respect to the resist pattern, and so on.

On the other hand, in the dry etching using the mixed gas of the chlorine-based gas and oxygen, although the vertical sectional shape of the chromium pattern is obtained as compared with that in the wet etching, there arises a problem such as resist recession or disappearance. Further, like in the wet etching, there are a problem of the occurrence of etching bias in which the chromium film is etched in the horizontal direction in pattern section, and so on.

What particularly arises as a problem is that, in either etching method, nonuniform etching bias and etching depth are obtained depending on the etching widths. For example, it is known that when etching portions simultaneously have a narrow width of 100 nm or less and a large width of 1 μm or more, there occurs a phenomenon in which the narrow-width portion becomes relatively narrow and shallow in etching depth. If the etching bias differs depending on the etching width, it is difficult to perform correction such as data bias to adjust the line width beforehand in exposure. This problem occurs more remarkably when the wet etching is carried out.

Further, in the dry etching using the chlorine-based gas containing oxygen, etching proceeds not only in a thickness direction of the resist but also in the horizontal direction in section of the resist. Therefore, the width of the resist changes while the chromium film is dry-etched and, as a result, the width of the chromium pattern also changes with respect to the width of the resist before the etching. Further, since the chromium pattern itself is gradually etched in the horizontal direction in section, the width of the chromium pattern becomes narrower than a desired dimension and it may happen that such a narrow-width pattern itself disappears.

Further, if the pattern is miniaturized, in addition to the problem of etching bias of the chromium film, restriction is imposed also on the thickness of the resist and, if the thickness of the resist becomes approximately three times or more the pattern width, there arise problems such as a reduction in resolution during exposure of the resist and pattern collapse after the formation of the resist pattern. When the chromium pattern is formed by dry etching using the chlorine-based gas containing oxygen, the resist gradually disappears by the etching and, therefore, if the thickness of the resist is set small, the resist disappears before completion of the formation of the chromium pattern so that chromium portions not to be etched are also etched. In the dry etching using the chlorine-based gas containing oxygen, the resist of a thickness equal to or greater than that of chromium is consumed. Further, in order to eliminate nonuniformity in etching depth, additional etching of twice or more long is carried out and, also during it, the thickness of the resist decreases. Therefore, the thickness of the chromium film capable of preventing disappearance of the resist in dry etching is limited to about ⅓ of that of the resist. For example, when the resist pattern having a width of 30 nm is formed, the thickness of the resist capable of preventing collapse of the pattern is 90 nm or less, while the thickness of the chromium film capable of preventing disappearance of the resist after etching is about 30 nm or less, i.e. being limited to be equal to or less than the pattern width.

In the meantime, the photomask cannot obtain sufficient light-shielding performance if the thickness of the thin film (light-shielding film) pattern is reduced. For example, in order to obtain an optical density of 3 or more (transmittance of 0.1% or less) at 193 nm being the wavelength of an ArF excimer laser, the thickness of the pattern made of, for example, chromium is required to be at least 45 nm or more. Taking into account only the thickness of the pattern, the limit of the pattern dimension is 45 nm. However, since the recession of the resist and the chromium pattern occurs during the formation of the chromium pattern as described above, the limit of the pattern dimension for enabling accurate production is greater than 45 nm.

In an actual photomask, due to restrictions such as the presence of an antireflection film, recession of a resist, etching progress in the horizontal direction in section of a pattern, nonuniformity in etching depth depending on the line widths, and uniformity over the entire surface of the mask, the limit of the pattern dimension that enables accurate production of a chromium film having a thickness of 45 nm and having an optical density of 3 or more at an exposure wavelength of 193 nm is about twice the pattern dimension. Therefore, there is a limit in achieving pattern miniaturization with the conventional technique.

As a method of solving nonuniformity in etching width and depth of the chromium film, the above-mentioned method disclosed in Patent Document 1 is known in which a thin film pattern comprising a plurality of layers is formed by multi-stage etching. In this method, although nonuniformity in etching depth is improved by an etching stopper, there is no disclosure about a method of preventing recession of the resist width that causes nonuniformity in etching width, a method of enabling a reduction in thickness of the resist which is required for forming a fine pattern, or the like, thus being still unable to sufficiently solve the prior art problems in terms of realizing a fine pattern.

Further, as a method of reducing the influence on the pattern width due to a change in resist width during dry etching to thereby enable a reduction in thickness of the resist, the above-mentioned method disclosed in Patent Document 2 is known in which a relatively thin film pattern is formed using a resist pattern as a mask and further, using the formed thin film pattern as a mask, thin film patterns of second and subsequent layers are formed. In this method, a chlorine-based gas containing oxygen is used as an etching gas for use in etching the thin film using the resist pattern as a mask, but since recession of the resist pattern occurs during dry etching, there is a problem that the excellent pattern accuracy cannot be obtained.

Therefore, this invention has been made in view of the above-mentioned prior art problems and has an object, firstly, to provide a mask blank that can form a fine pattern with high pattern accuracy in the manufacture of an imprint mold (stamper) and, secondly, to provide a method of manufacturing an imprint mold formed with a highly accurate fine pattern using such a mask blank.

Means for Solving the Problem

Specifically, in order to solve the above-mentioned problems, this invention has the following Structures.

(Structure 1) A mask blank comprising a thin film for forming a pattern on a transparent substrate, wherein said mask blank is a mask blank for dry etching adapted to an imprint mold manufacturing method that etches each of said thin film and said substrate by dry etching using an etching gas substantially free of oxygen, wherein:

said thin film comprises a laminated film of at least an upper layer and a lower layer, said upper layer is formed of a material containing chromium (Cr) and nitrogen, and said lower layer is formed of a material containing a compound mainly composed of tantalum (Ta) or containing at least one element of hafnium (Hf) and zirconium (Zr) or its compound and capable of being etched by dry etching using a chlorine-based gas.

(Structure 2) A mask blank according to Structure 1, wherein said upper layer of said thin film has a thickness of 1.5 nm to 3 nm.

(Structure 3) A mask blank according to Structure 1 or 2, wherein said lower layer of said thin film has a thickness of 3 nm to 10 nm.

(Structure 4) A mask blank according to any one of Structures 1 to 3, wherein a resist film to be formed on said thin film has a thickness of 100 nm or less.

(Structure 5) An imprint mold manufacturing method comprising etching said upper layer and said lower layer of said thin film in the mask blank according to any of Structures 1 to 4 by dry etching with a chlorine-based gas substantially free of oxygen to form a pattern of said thin film and then etching said substrate by dry etching with a fluorine-based gas using said pattern of said thin film as a mask.

Effect of the Invention

According to this invention, it is possible to provide a mask blank that can form a fine pattern with high pattern accuracy in the manufacture of an imprint mold.

Further, according to this invention, it is possible to provide a method of manufacturing an imprint mold formed with a highly accurate fine pattern using such a mask blank.

Figure 1:
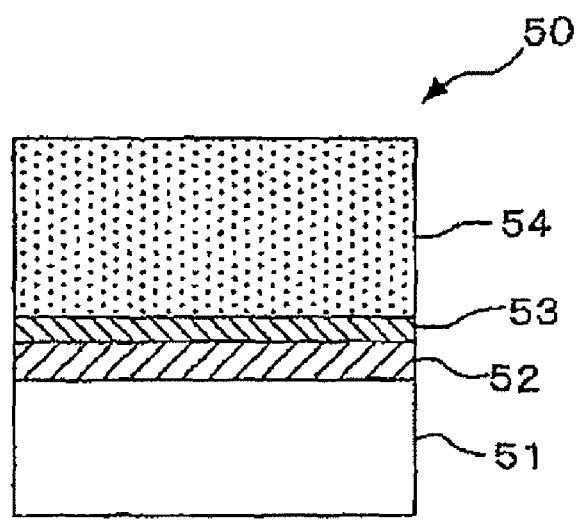
FIG. 1 is a schematic sectional view of a mask blank for the manufacture of an imprint mold according to an embodiment 1 of this invention.

DESCRIPTION OF SYMBOLS 50 mask blank
51 substrate
52 conductive film
53 light-shielding film
54 resist film
55 laminated film pattern

BEST MODE FOR CARRYING OUT THE INVENTION

Herein, a supplementary description will be given of the above-mentioned Structures 1 and 5.

As described in the Structure 1, a mask blank comprises a thin film for forming a pattern on a transparent substrate, wherein the mask blank is a mask blank for dry etching adapted to an imprint mold manufacturing method that etches each of the thin film and the substrate by dry etching using an etching gas substantially free of oxygen, wherein: the thin film comprises a laminated film of at least an upper layer and a lower layer, the upper layer is formed of a material containing chromium (Cr) and nitrogen, and the lower layer is formed of a material containing a compound mainly composed of tantalum (Ta) or containing at least one element of hafnium (Hf) and zirconium (Zr) or its compound and capable of being etched by dry etching using a chlorine-based gas.

According to the mask blank of this invention, it is possible to form a fine pattern with high pattern accuracy in the manufacture of an imprint mold or the like. Since the light-shielding pattern can be formed as a highly accurate fine pattern using the mask blank of this invention, a highly accurate fine pattern can also be formed for a pattern of the transparent substrate to be formed by etching using the light-shielding pattern as a mask.

Herein, a glass substrate such as a quartz substrate is generally used as the transparent substrate. Since the glass substrate is excellent in flatness and smoothness, when pattern transfer onto a semiconductor substrate is performed using a photomask, high-accuracy pattern transfer can be carried out without causing strain or the like of a transfer pattern.

The mask blank of this invention is a mask blank for dry etching adapted to an imprint mold manufacturing method that patterns at least the thin film by dry etching using an etching gas substantially free of oxygen.

In order to accurately form a fine pattern, for example, a pattern of half-pitch 32 nm or less, there are things to be accomplished such as reducing the thickness of a resist, suppressing the etching progress (resist recession) in a horizontal direction in section of a resist pattern, and suppressing the etching progress (etching isotropy) in the horizontal direction in section of a thin film pattern. When a thin film pattern is formed by wet etching, the etching progress in the horizontal direction in section of the thin film pattern occurs essentially, and therefore, dry etching is preferable for forming a fine pattern as in this invention.

When forming a thin film pattern by dry etching, in order to reduce the thickness of a resist, there are a method of reducing the etching rate of a resist and a method of reducing the etching time of a thin film to be patterned using a resist pattern as a mask.

In dry etching processing for an imprint mold, a mixed gas of chlorine and oxygen has generally been used heretofore as an etching gas, while the mask blank of this invention is a mask blank for dry etching using an etching gas substantially free of oxygen. Particularly in dry etching with a chlorine-based gas substantially free of oxygen, the etching progress in the horizontal direction in section of a resist pattern is smaller than that in etching with a chlorine-based gas containing oxygen so that it is possible to suppress a change in dimension of a resist. Therefore, in this invention, dry etching with a chlorine-based gas substantially free of oxygen is most preferable as dry etching of the upper layer and the lower layer of the thin film in the mask blank. Substantially free of oxygen represents not only a case where no oxygen is contained at all, but also a case where even if oxygen generated in an etching apparatus is contained, the content thereof is 5% or less.

In order to reduce the etching time of a thin film, there are a method of increasing the dry etching rate of a thin film to be patterned and a method of reducing the thickness of a thin film to be patterned. Particularly in an exposure mask, a thin film is required to have a certain or greater thickness in terms of ensuring the light-shielding property at an exposure wavelength and therefore there is a limit in reducing the thickness of the thin film. Accordingly, it is necessary to select a material with a high dry etching rate as a thin film (pattern forming layer). In the mask blank of this invention, the thin film comprises a laminated film of at least an upper layer and a lower layer, wherein the upper layer is formed of a material containing chromium (Cr) and nitrogen. Since the upper layer is oxidized by exposure to the atmosphere after the film formation and baking in a resist coating process, a high dry etching rate can be obtained in etching with, for example, a chlorine-based gas substantially free of oxygen and, further, the upper layer has a sufficient resistance to cleaning with aqueous ammonia, a sulfuric acid hydrogen peroxide mixture, or the like in exposure mask manufacturing processes. It is preferable that the lower layer of the thin film be also formed of a material that can achieve a high dry etching rate in etching with, for example, a chlorine-based gas substantially free of oxygen and has a sufficient resistance to the above-mentioned cleaning. As such a material, there can be cited a material that contains a compound mainly composed of tantalum (Ta) and is capable of being etched by dry etching using a chlorine-based gas. In this invention, a Ta compound such as, for example, TaHf, TaZr, or TaHfZr is preferable. It is also possible to select a material in which, using such a Ta compound as a base material, a secondary material such as, for example, B, Ge, Nb, Si, C, or N is added. The lower layer made of such a Ta compound can have conductivity necessary for preventing charge-up during electron beam writing in the manufacture of a mask and, further, it is possible to obtain a large contrast in alignment. Alternatively, as a material of the lower layer, it is possible to select at least one element of hafnium (Hf) and zirconium (Zr) or its compound (e.g. HfZr or the like) and, further, it is also possible to select a material in which, using such a material as a base material, a secondary material such as, for example, B, Ge, Nb, Si, C, or N is added.

Of the thin film, the upper layer formed of the material containing chromium (Cr) and nitrogen is preferably optimized in thickness so that it is preferably entirely oxidized by exposure to the atmosphere after the film formation and baking in the resist coating process to thus achieve a good dry etching rate in etching with, for example, the chlorine-based gas substantially free of oxygen. It is preferable that the upper layer mainly have a light-shielding property and be optimized in thickness so as to have a thickness necessary for forming a fine line-and-space pattern of, for example, half-pitch 32 nm or less by etching with, for example, the chlorine-based gas substantially free of oxygen.

From this point of view, in this invention, the thickness of the upper layer is preferably in the range of 1.5 to 3 nm. If the thickness of the upper layer (e.g. CrN) is less than 1.5 nm, not only the upper layer is oxidized but also an oxide layer is formed at a surface of the lower layer due to exposure to the atmosphere after the film formation and, further, the surface oxidation of the lower layer proceeds due to baking in the resist coating process. This oxide layer is not preferable because it significantly reduces the etching rate in etching with, for example, the chlorine-based gas substantially free of oxygen to impede the etching progress. On the other hand, if the thickness of the upper layer is greater than 3 nm, oxidation by exposure to the atmosphere after the film formation does not proceed entirely so that there remains a region of the CrN layer where etching with, for example, the chlorine-based gas substantially free of oxygen is difficult to proceed, which is thus not preferable.

Of the thin film, the lower layer formed of the material that contains, for example, the compound mainly composed of Ta and is capable of being etched by dry etching using the chlorine-based gas preferably has a thickness in the range of 3 to 10 nm in this invention in terms of mainly imparting it the conductivity.

In order to suppress etching in the horizontal direction in section of a thin film pattern, there are a method of selecting a material that requires the impact of ions for the progress of dry etching and a method of adding an etching gas that produces a deposit on side walls of a pattern. Since the etching rate of a resist is small in etching with, for example, a chlorine-based gas substantially free of oxygen, if use is made of a deposition gas (e.g. a gas containing at least one of carbon and silicon and chlorine or fluorine) that suppresses etching on side walls of a thin film pattern, there is a case where foreign matter unable to be removed is deposited on the pattern surface and side walls in additional etching (overetching) or depending on the surface area of the resist. Therefore, it is preferable not to add a deposition gas in etching with a gas substantially free of oxygen.

A method of forming the thin film for forming a pattern on the substrate is not particularly limited, but among all, a sputtering film forming method is preferably cited. According to the sputtering film forming method, it is possible to form a uniform film with a fixed thickness, which is thus preferable. When forming, for example, a TaHf film as the lower layer of the thin film according to the sputtering film forming method, a target comprising a TaHf alloy is used as a sputtering target and an inert gas such as argon gas, helium gas, or xenon gas is used as a sputtering gas introduced into a chamber. On the other hand, when forming a chromium nitride film as the upper layer of the thin film according to the sputtering film forming method, a chromium (Cr) target is used as a sputtering target and a mixture of nitrogen and an inert gas such as argon gas or helium gas is used as a sputtering gas introduced into a chamber.

As described in a later embodiment, the mask blank of this invention may have a configuration in which a resist film is formed on the thin film.

As in the Structure 5, this invention provides an imprint mold manufacturing method that etches the upper layer and the lower layer of the thin film in the mask blank of this invention by dry etching using a chlorine-based gas substantially free of oxygen and then etches the substrate by dry etching using a fluorine-based gas.

In this invention, in the manufacture of, for example, an imprint mold, the upper layer and the lower layer of the thin film are etched by dry etching using the chlorine-based gas substantially free of oxygen using a resist pattern on the mask blank as a mask, thereby forming a pattern of the thin film, and then, using the thin film pattern as a mask, the substrate is etched by dry etching using the fluorine-based gas. Therefore, an object of dry etching using as the mask the resist pattern formed on the mask blank is only the thin film and, further, the thicknesses of the upper layer and the lower layer of the thin film can be optimized in terms of fine pattern formation so that even if the thickness of the resist film is thinner than conventional, a fine pattern can be formed without causing lack of the thickness of the resist.

In this invention, in terms of forming a fine pattern of, for example, half-pitch 32 nm or less, the thickness of the resist film formed on the thin film can be set to 100 nm or less and is preferably set to the range of particularly 40 to 80 nm.

Hereinbelow, the best mode for carrying out this invention will be described in detail with reference to the drawings.

Figure 2:
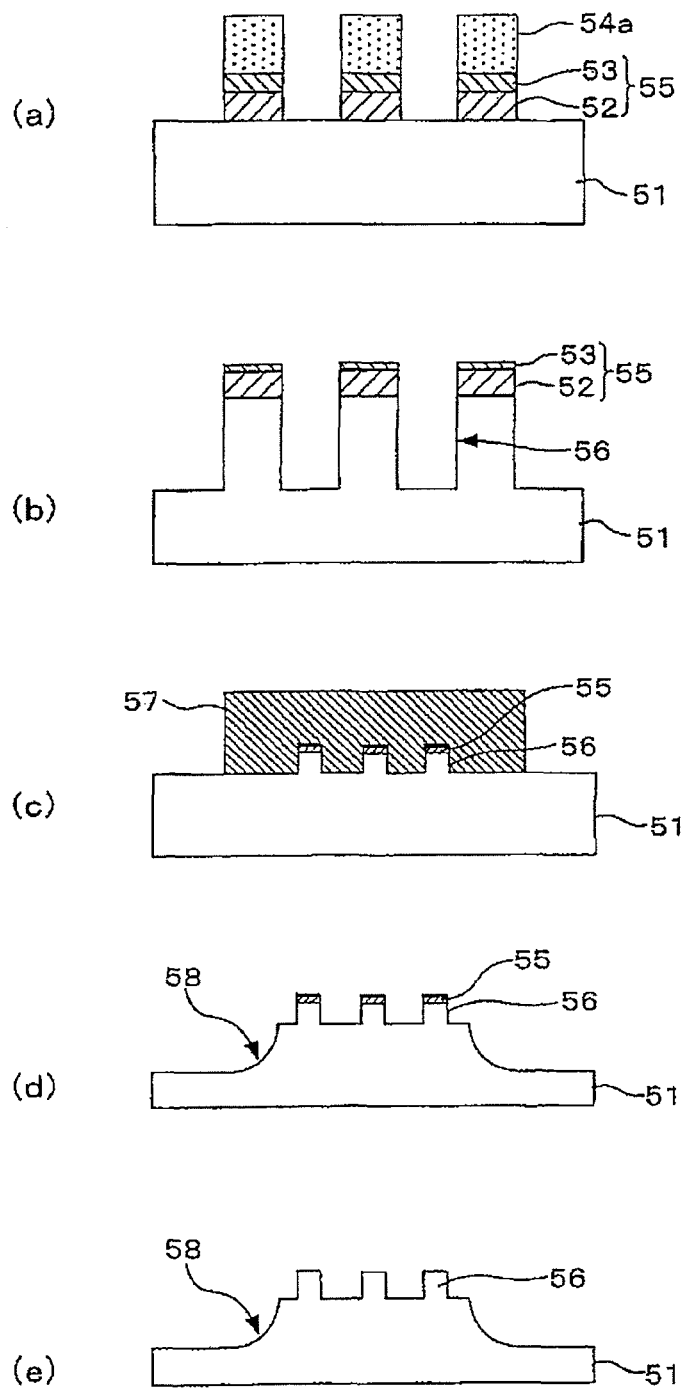
FIG. 2 shows schematic sectional views (a) to (e) for explaining imprint mold manufacturing processes according to the embodiment 1 of this invention.

This embodiment 1 is an imprint mold for use in manufacturing processes of a semiconductor device. FIG. 1 is a schematic sectional view of a mask blank for the manufacture of a mold according to this embodiment 1 and FIG. 2 is schematic sectional views for explaining imprint mold manufacturing processes.

As shown in FIG. 1, a mask blank 50 for use in this embodiment 1 is configured to have a laminated film of a conductive film (lower layer) 52 and a light-shielding film (upper layer) 53 and a resist film 54 in this order over a transparent substrate 51. This mask blank 50 is produced in the following manner.

A synthetic quartz substrate (size 152 mm×152 mm×thickness 6.35 mm) as the transparent substrate 51 was introduced into a sputtering apparatus. A target comprising an alloy of tantalum (Ta) and hafnium (Hf) (tantalum:hafnium=80:20 in atomic ratio) was sputtered in an argon gas to form the conductive film 52 made of a tantalum-hafnium alloy and having a thickness of 7 nm and, then, without exposure to the atmosphere, a chromium target was sputtered in a mixed gas of argon and nitrogen to form the thin film (light-shielding film) 53 of chromium nitride (chromium:nitrogen=35:65 in atomic ratio) to a thickness of 2.5 nm. Over the quartz substrate thus formed with the laminated film of the tantalum-hafnium alloy film and the chromium nitride film, the resist film (ZEP520A manufactured by Zeon Corporation) 54 for electron beam writing was coated to a thickness of 50 nm, thereby obtaining the mask blank 50 for use in this embodiment 1.

Then, using an electron beam writer, a line-and-space pattern of half-pitch 20 nm was written on the resist film 54 of the mask blank 50. Then, the resist film 54 was developed to form a resist pattern 54a, thereby obtaining a mold manufacturing blank.

Then, the mold manufacturing blank formed with the resist pattern 54a was introduced into a dry etching apparatus and subjected to etching with an oxygen-free chlorine gas, thereby forming a pattern 55 comprising the laminated film of the tantalum-hafnium alloy film (conductive film 52) and the chromium nitride film (light-shielding film 53) as shown in FIG. 2(*a*). In this event, an etching end point was judged using a reflecting optical end point detector.

Subsequently, in the same dry etching apparatus, dry etching using a fluorine-based ($CHF_3$) gas was carried out to etch the quartz substrate 51 using the laminated film pattern 55 as a mask, thereby forming a quartz pattern 56 shown in FIG. 2(*b*). In this event, the etching time was adjusted so that the depth of the quartz pattern 56 became 70 nm. Herein, in order to confirm the pattern sectional shape, a blank for evaluation produced in the same manner as described above was broken to thereby observe a pattern section using a scanning electron microscope. As a result, the resist pattern disappeared so that a surface of the chromium nitride was exposed. The thickness of the chromium nitride, which was 2.5 nm before the etching, was reduced to about 1 nm, but it was confirmed that the width of the quartz pattern 56 was approximately equal to that of the pattern 55 comprising the laminated film of the tantalum-hafnium alloy film and the chromium nitride film and that the depth of the quartz pattern 56 was uniform.

Then, a photoresist (iP3500 manufactured by Tokyo Ohka Kogyo Co., Ltd.) was coated to a thickness of 460 nm on the mold manufacturing blank formed with the quartz pattern 56 and then was subjected to exposure by ultraviolet light and development, thereby forming a resist pattern 57 for a pedestal structure shown in FIG. 2(*c*).

Then, the mold manufacturing blank formed with the resist pattern 57 was wet-etched using a mixed solution of hydrofluoric acid and ammonium fluoride (HF concentration 4.6 wt %, $NH_4F$ concentration 36.4 wt %) and then the resist was removed by predetermined acid cleaning, thereby producing a pedestal structure 58 having a depth of, for example, about 15 μm as shown in FIG. 2(*d*). Further, the laminated film pattern 55 was removed by dry etching using a chlorine gas, thereby obtaining an imprint mold of the structure shown in FIG. 2(*e*).

In the obtained imprint mold, since the sectional shape of the laminated film pattern 55 was a vertical shape and thus excellent and further the pattern accuracy of the laminated film pattern 55 was also excellent, a pattern excellent in dimension and accuracy was obtained also for the quartz pattern 56.

As the conductive film 52, use may be made of, for example, a tantalum-zirconium alloy instead of the tantalum-hafnium alloy.

Next, the best modes when this invention is applied to imprint molds (stampers) for use in a process of removing a magnetic material of a DTR medium by grooving and in a process of processing a magnetic pattern of a patterned medium will be described in detail with reference to FIG. 1 and part of FIG. 2.

In the case of an imprint mold in this embodiment 2, as a mask blank for use therefor, use is made of a mask blank 50 having the same structure as that of the mask blank 50 used in the embodiment 1 shown in FIG. 1 except that a disk-shaped synthetic quartz substrate having a diameter of 150 mm and a thickness of 6.35 mm is used as a transparent substrate 51.

Hereinbelow, there is shown a sequence of manufacturing an imprint mold for use in a grooving process of a 2.5-inch DTR medium. On a resist film 54 in a mask blank 50 of FIG. 1, an area surrounded by concentric circles with an outer diameter of 65 mm and an inner diameter of 20 mm was set as a groove pattern forming area and the resist film 54 in an area outside the circle of the outer diameter 65 mm and in an area inside the circle of the inner diameter 20 mm was entirely exposed using an electron beam writer. Then, in the groove pattern forming area, a groove pattern with a line width of 40 nm and a space width of 80 nm was exposed by the electron beam writer. Then, the exposed resist film 54 was developed and rinsed, thereby forming a resist pattern 54a having the groove pattern. The imprint mold manufactured herein is of the type that is used in a transfer process of direct transfer onto a resist film on the DTR medium and, therefore, 120 nm-pitch tracks with a magnetic layer width of 80 nm and a groove width (nonmagnetic layer width when grooves are filled with a nonmagnetic substance) of 40 nm will be formed as a pattern of a magnetic recording surface finally formed on the DTR medium.

Then, the mold manufacturing blank formed with the resist pattern 54a was introduced into a dry etching apparatus and subjected to etching with an oxygen-free chlorine gas, thereby forming a pattern 55 comprising a laminated film of a tantalum-hafnium alloy film (conductive film 52) and a chromium nitride film (light-shielding film 53) as shown in FIG. 2(*a*). In this event, an etching end point was judged using a reflecting optical end point detector.

Subsequently, in the same dry etching apparatus, dry etching using a fluorine-based ($CHF_3$) gas was carried out to etch a quartz substrate 51 using the laminated film pattern 55 as a mask, thereby forming a quartz pattern 56 shown in FIG. 2(*b*). In this event, the etching time was adjusted so that the depth of the quartz pattern 56 became 100 nm. Herein, in order to confirm the pattern sectional shape, a blank for evaluation produced in the same manner as described above was broken to thereby observe a pattern section using a scanning electron microscope. As a result, the resist pattern disappeared so that a surface of the chromium nitride was exposed. The thickness of the chromium nitride, which was 2.5 nm before the etching, was reduced to about 1 nm, but it was confirmed that the width of the quartz pattern 56 was approximately equal to that of the pattern 55 comprising the laminated film of the tantalum-hafnium alloy film and the chromium nitride film and that the depth of the quartz pattern 56 was uniform.

Then, a photoresist (iP3500 manufactured by Tokyo Ohka Kogyo Co., Ltd.) was coated to a thickness of 460 nm on the mold manufacturing blank formed with the quartz pattern 56 and then was subjected to exposure by ultraviolet light and development in the area outside the circle of the outer diameter 65 mm, thereby forming a resist pattern 57 for a pedestal structure shown in FIG. 2(*c*).

Then, the mold manufacturing blank formed with the resist pattern 57 was wet-etched using a mixed solution of hydrofluoric acid and ammonium fluoride (HF concentration 4.6 wt %, $NH_4F$ concentration 36.4 wt %) and then the resist was removed by predetermined acid cleaning, thereby producing a pedestal structure 58 having a depth of, for example, about 15 μm as shown in FIG. 2(*d*). Further, the laminated film pattern 55 was removed by dry etching using a chlorine gas, thereby obtaining an imprint mold, having the structure shown in FIG. 2(*e*), for use in a grooving process of a DTR medium.

In the obtained imprint mold, since the sectional shape of the laminated film pattern 55 was a vertical shape and thus excellent and further the pattern accuracy of the laminated film pattern 55 was also excellent, a pattern excellent in dimension and accuracy was obtained also for the quartz pattern 56. This imprint mold was applied to a grooving process in the manufacture of DTR media and, as a result, all the grooved DTR media had grooves transferred with high accuracy and were quite excellent.

Through the same manufacturing processes, there were manufactured an imprint mold (line width of the mold: 25 nm, groove width of the mold: 58 nm) for producing a DTR medium with a track pitch of 83 nm and an imprint mold (line width of the mold: 23 nm, groove width of the mold: 10 nm) for producing a DTR medium with a track pitch of 33 nm. As a result, patterns were excellent in both dimension and accuracy. Further, these imprint molds were each applied to a pattern processing process in the manufacture of patterned media and, as a result, all the grooved DTR media had grooves transferred with high accuracy and were quite excellent.

Through the same manufacturing processes, there were manufactured an imprint mold (line width of the mold: 18 nm, groove width of the mold: 7 nm) for producing a patterned medium with a track pitch of 25 nm and an imprint mold (line width of the mold: 20 nm, groove width of the mold: 6 nm) for producing a patterned medium with a track pitch of 33 nm. As a result, patterns were excellent in both dimension and accuracy. Further, these imprint molds were each applied to a pattern processing process in the manufacture of patterned media and, as a result, all the grooved DTR media had grooves transferred with high accuracy and were quite excellent.

The invention claimed is:

1. A mask blank comprising a thin film for forming a pattern on a transparent substrate, wherein said mask blank is a mask blank subjected to dry etching adapted to an imprint mold manufacturing method that etches each of said thin film and said substrate by dry etching using an etching gas substantially free of oxygen, wherein:

said thin film comprises a laminated film of at least an upper layer and a lower layer, said upper layer is formed of a material comprising chromium (Cr) and nitrogen, and said lower layer is formed of a material comprising a compound mainly composed of tantalum (Ta) or comprising at least one element of hafnium (Hf) and zirconium (Zr) or its compound, and wherein:

both said upper layer and said lower layer are capable of being etched by dry etching using a chlorine-based gas substantially free of oxygen.

2. A mask blank according to claim 1, wherein said upper layer of said thin film has a thickness of 1.5 nm to 3 nm.

3. A mask blank according to claim 1, wherein said lower layer of said thin film has a thickness of 3 nm to 10 nm.

4. A mask blank according to claim 1, wherein a resist film to be formed on said thin film has a thickness of 100 nm or less.

5. An imprint mold manufacturing method comprising etching said upper layer and said lower layer of said thin film in the mask blank according to claim 1 by dry etching with a chlorine-based gas substantially free of oxygen to form a pattern of said thin film and then etching said substrate by dry etching with a fluorine-based gas using said pattern of said thin film as a mask.

6. A mask blank according to claim 2, wherein said lower layer of said thin film has a thickness of 3 nm to 10 nm.

7. A mask blank according to claim 2, wherein a resist film to be formed on said thin film has a thickness of 100 nm or less.

8. A mask blank according to claim 3, wherein a resist film to be formed on said thin film has a thickness of 100 nm or less.

* * * * *